(12) United States Patent
Brown et al.

(10) Patent No.: US 7,822,086 B2
(45) Date of Patent: Oct. 26, 2010

(54) LASER PROJECTION TEMPERATURE COMPENSATION

(75) Inventors: Margaret K. Brown, Seattle, WA (US); Randall B. Sprague, Carnation, WA (US); Michael L. Schaaf, Bainbridge Island, WA (US); Bin Xue, Mukilteo, WA (US)

(73) Assignee: Microvision, Inc., Redmond, WA (US)

( * ) Notice: Subject to any disclaimer, the term of this patent is extended or adjusted under 35 U.S.C. 154(b) by 651 days.

(21) Appl. No.: 11/829,459

(22) Filed: Jul. 27, 2007

(65) Prior Publication Data

US 2009/0028199 A1 Jan. 29, 2009

(51) Int. Cl.
*H01S 3/00* (2006.01)

(52) U.S. Cl. ............. 372/38.02; 372/38.01; 372/38.07; 372/29.01; 372/29.015; 372/29.02; 372/34

(58) Field of Classification Search .................. 372/8, 372/34, 38.01, 38.02, 38.07, 29.01, 29.015, 372/29.02
See application file for complete search history.

(56) References Cited

U.S. PATENT DOCUMENTS

| 5,414,280 | A | | 5/1995 | Girmay | |
|---|---|---|---|---|---|
| 5,747,791 | A | * | 5/1998 | Coroy | 250/214 R |
| 5,844,928 | A | * | 12/1998 | Shastri et al. | 372/38.02 |
| 5,929,442 | A | * | 7/1999 | Higashi | 250/339.13 |
| 6,201,820 | B1 | * | 3/2001 | Palmer | 372/32 |
| 2002/0196595 | A1 | | 12/2002 | Ciancio | |
| 2003/0012244 | A1 | * | 1/2003 | Krasulick et al. | 372/50 |
| 2004/0136729 | A1 | | 7/2004 | Robinson et al. | |
| 2005/0083978 | A1 | | 4/2005 | Kim | |
| 2005/0265419 | A1 | | 12/2005 | Fujii et al. | |
| 2006/0056470 | A1 | * | 3/2006 | Liu et al. | 372/38.1 |
| 2007/0047603 | A1 | * | 3/2007 | Oomori | 372/34 |
| 2008/0247429 | A1 | * | 10/2008 | Colbourne | 372/26 |

FOREIGN PATENT DOCUMENTS

| EP | 0660585 | 6/1995 |
|---|---|---|
| EP | 1701589 | 9/2006 |

\* cited by examiner

*Primary Examiner*—Minsun Harvey
*Assistant Examiner*—Delma R Forde
(74) *Attorney, Agent, or Firm*—Kevin D. Wills

(57) ABSTRACT

The temperature of a laser diode changes in response to video content across a line of a displayed image, and the radiance changes as a function of temperature. An adaptive model estimates the temperature of the laser diode based on prior drive current values. For each displayed pixel, diode drive current is determined from the estimated diode temperature and a desired radiance value. A feedback circuit periodically measures the actual temperature and updates the adaptive model.

8 Claims, 7 Drawing Sheets

LASER PROJECTION TEMPERATURE COMPENSATION

FIELD

The present invention relates generally to laser diodes, and more specifically to temperature compensation in laser diodes.

BACKGROUND

Laser diodes emit light when current is passed through the diode. The output radiance of the laser diode varies as the drive current through the diode is varied. The output radiance of the laser diode also varies as the temperature of the diode varies. This can be problematic in part because the temperature of a laser diode may be affected by the historical drive current. This "self heating" causes the output radiance to vary not only as a function of the drive current through the laser diode, but also as a function of historical drive current.

DESCRIPTION OF EMBODIMENTS

Figure 1:
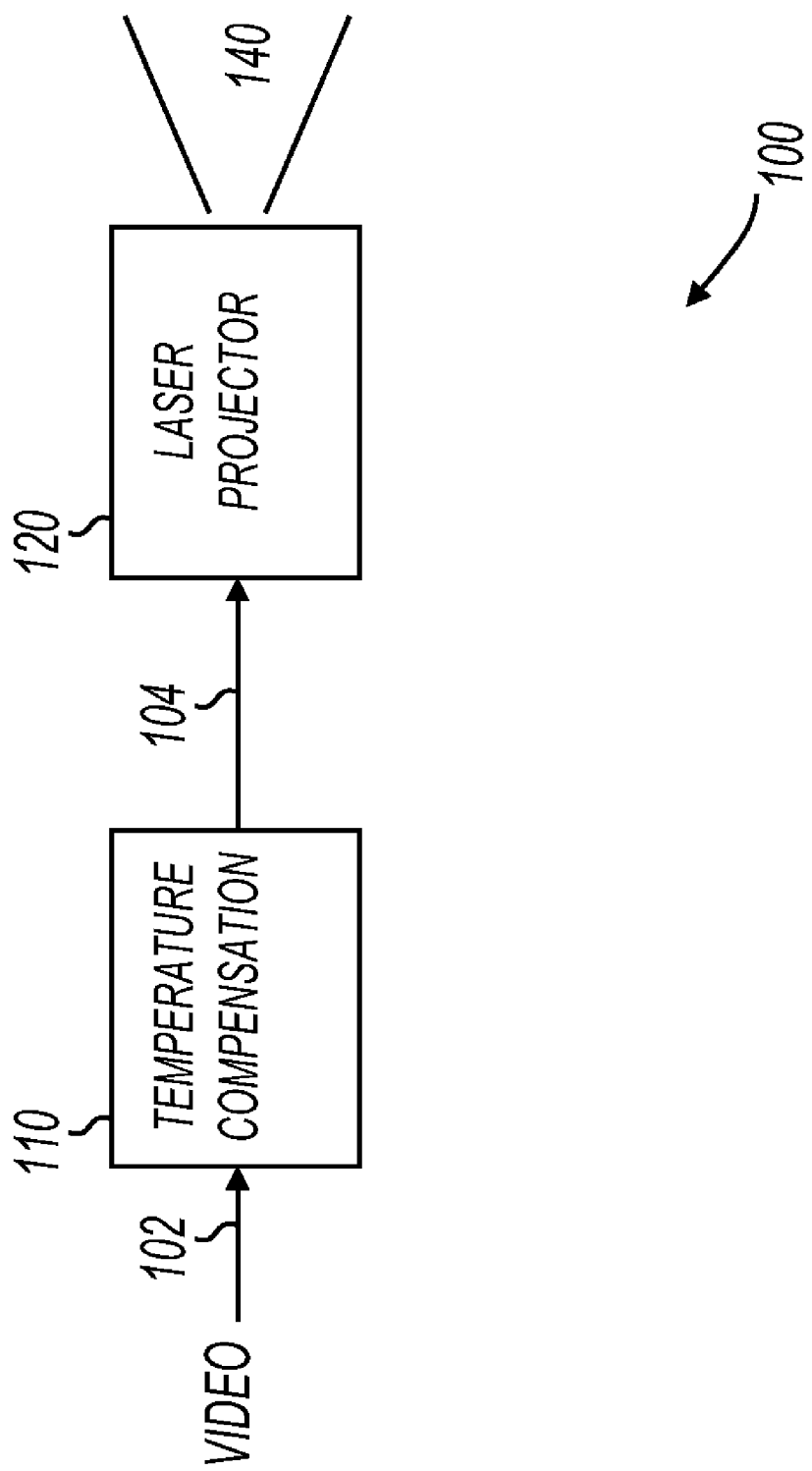
FIG. 1 shows a laser projection apparatus with temperature compensation.

In the following detailed description, reference is made to the accompanying drawings that show, by way of illustration, specific embodiments in which the invention may be practiced. These embodiments are described in sufficient detail to enable those skilled in the art to practice the invention. It is to be understood that the various embodiments of the invention, although different, are not necessarily mutually exclusive. For example, a particular feature, structure, or characteristic described herein in connection with one embodiment may be implemented within other embodiments without departing from the spirit and scope of the invention. In addition, it is to be understood that the location or arrangement of individual elements within each disclosed embodiment may be modified without departing from the spirit and scope of the invention. The following detailed description is, therefore, not to be taken in a limiting sense, and the scope of the present invention is defined only by the appended claims, appropriately interpreted, along with the full range of equivalents to which the claims are entitled. In the drawings, like numerals refer to the same or similar functionality throughout the several views.

FIG. 1 shows a laser projection apparatus with temperature compensation. Apparatus 100 include laser projector 120 and temperature compensation component 110. In operation, temperature compensation component 110 receives video data on node 102 and produces a "radiance" signal on node 104. Laser projector 120 receives the radiance signal on node 104 and projects light at 140. In some embodiments, laser projector 120 receives a variable current on node 104 and this current is passed through a laser diode. In other embodiments, laser projector 120 receives digital data on node 104 and laser projector 120 includes a digital to analog converter (DAC) to produce the current to pass through the laser diodes.

Laser projector 120 heats up when emitting light. Laser diode(s) within laser projector 120 may heat up by varying amounts based on the amount of drive current in each diode. Further, multiple historical drive currents may have a cumulative heating effect on the laser diodes. As the temperature of a laser diode changes, the radiance for a given drive current also changes. Temperature compensation component 110 accounts for effects of laser diode heating and varies the radiance signal 104 based on the temperature (or predicted temperature) of laser diode(s) within laser projector 120.

In some embodiments, laser projector 120 scans a light beam back and forth horizontally and up and down vertically to "paint" an image. The radiance of the light is changed at discrete points to illuminate pixels on a display surface. As the light beam traverses a single horizontal scan line, the laser diode producing the light may heat up by varying amounts based on the laser diode drive currents that are passed through the diodes to produce varying amounts of light at pixel locations on the scan line. In some embodiments, temperature compensation component 110 predicts the amount of diode heating caused by the historical drive current values in a scan line, and adjusts the present radiance data accordingly.

Temperature compensation component 110 may also include an adaptive model that is updated periodically to improve diode temperature predictions. For example, in some embodiments, temperature compensation component 110 periodically measures a voltage across a laser diode in laser projector 120 and updates parameters in an adaptive model. Various adaptive models are described further below.

Figure 2:
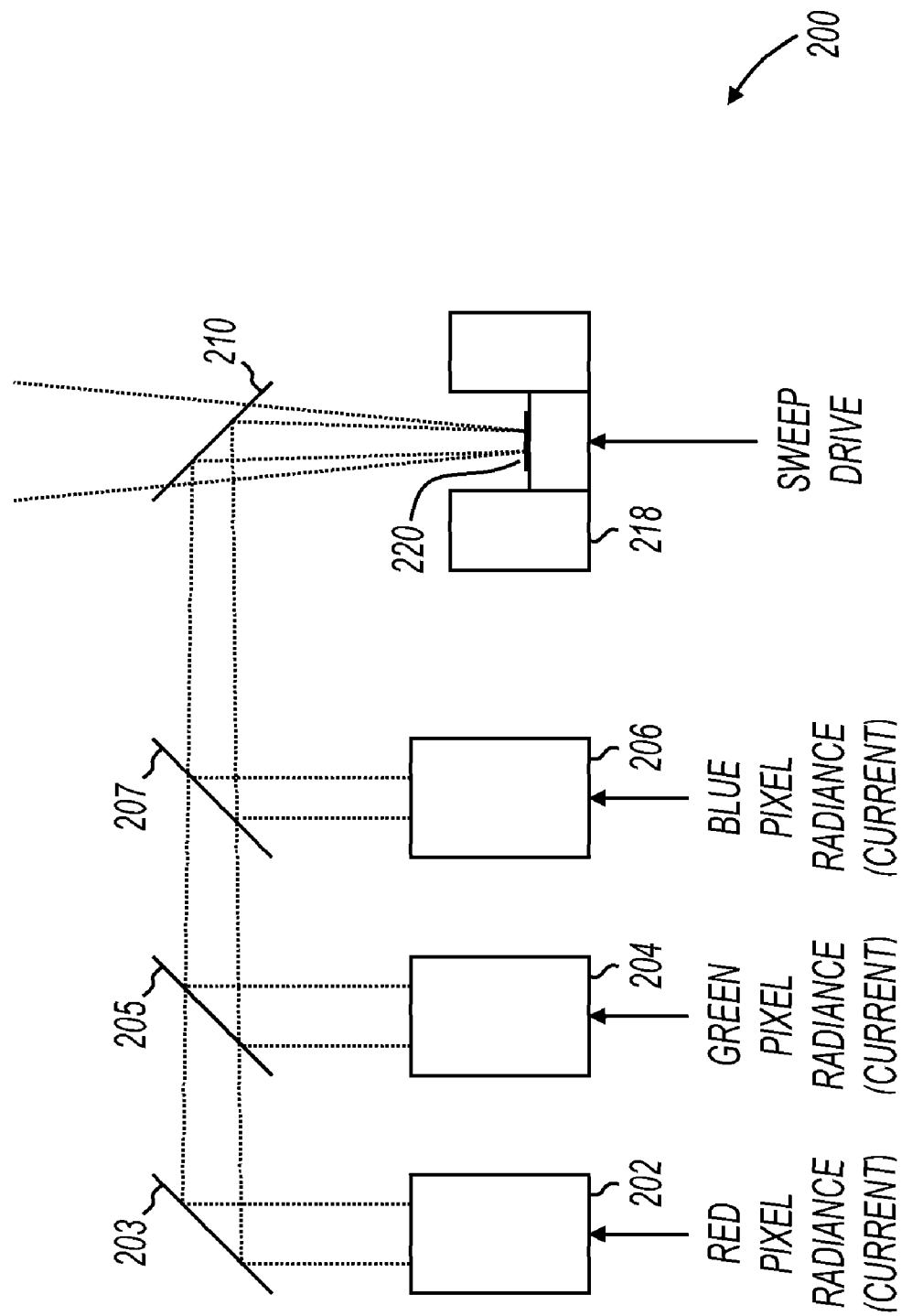
FIG. 2 shows a micro-projector.

FIG. 2 shows a micro-projector suitable for use in the temperature compensated laser projection apparatus embodiments. Projector 200 may be used in apparatus 100 (FIG. 1) as laser projector 120, although this is not a limitation of the present invention.

Projector 200 includes laser diodes 202, 204, and 206. Projector 200 also includes mirrors 203, 205, and 207, filter/polarizer 210, and micro-electronic machine (MEMS) device 218 having mirror 220. The laser diodes are driven by red, green, and blue radiance data (current) as described with reference to FIG. 1. Red, green, and blue light is provided by the laser diodes. One advantage of lasers is that their light is produced as a column, and this column emerges as a narrow beam. When each beam is directed at the MEMS mirror (either directly or through guiding optics) the colors of light can be mixed on the surface of the mirror, pixel by pixel.

The MEMS mirror rotates on two axes to sweep the light beams in both horizontal and vertical directions. The trajectory that the beam takes is a function of the signals received from the sweep drive. In some embodiments, the beam may sweep back and forth horizontally in a sinusoidal pattern. Further, in some embodiments, the beam may sweep up and down vertically in a sinusoidal pattern. In general, the beam may be swept in any combination of horizontal and vertical patterns, including linear and non-linear patterns. Pixels may be displayed when the beam is sweeping in one direction or in both directions. For example, in some embodiments, pixels may be displayed as the beam sweeps down in the vertical direction, but not when the beam sweeps back up. Also for example, in some embodiments, pixels may be displayed as the beam sweeps down as well as when the beam sweeps up in the vertical direction.

This process of picture-building can be repeated many times per second, to reproduce moving pictures. Therefore, a MEMS mirror and three colored light sources can function like a traditional CRT monitor or television set, but without the metal and glass vacuum tube, and without the phosphors on a screen. Instead, this produces a small projector, with a nearly infinite focal point.

By using solid-state colored continuous beam laser diodes, it is possible to build such a projection device on the millimeter scale. Further, by modulating the power to each laser diode as needed to produce a particular color, it is possible to greatly reduce the electrical requirements of such a device. Together, this yields a projection device that can fit into a small form factor device, and that can run reliably on its stored battery power. The MEMS based projector is described as an example, and the various embodiments of the invention are not so limited. For example, other projector types may be included in temperature compensated projection systems without departing from the scope of the present invention.

Figure 3:
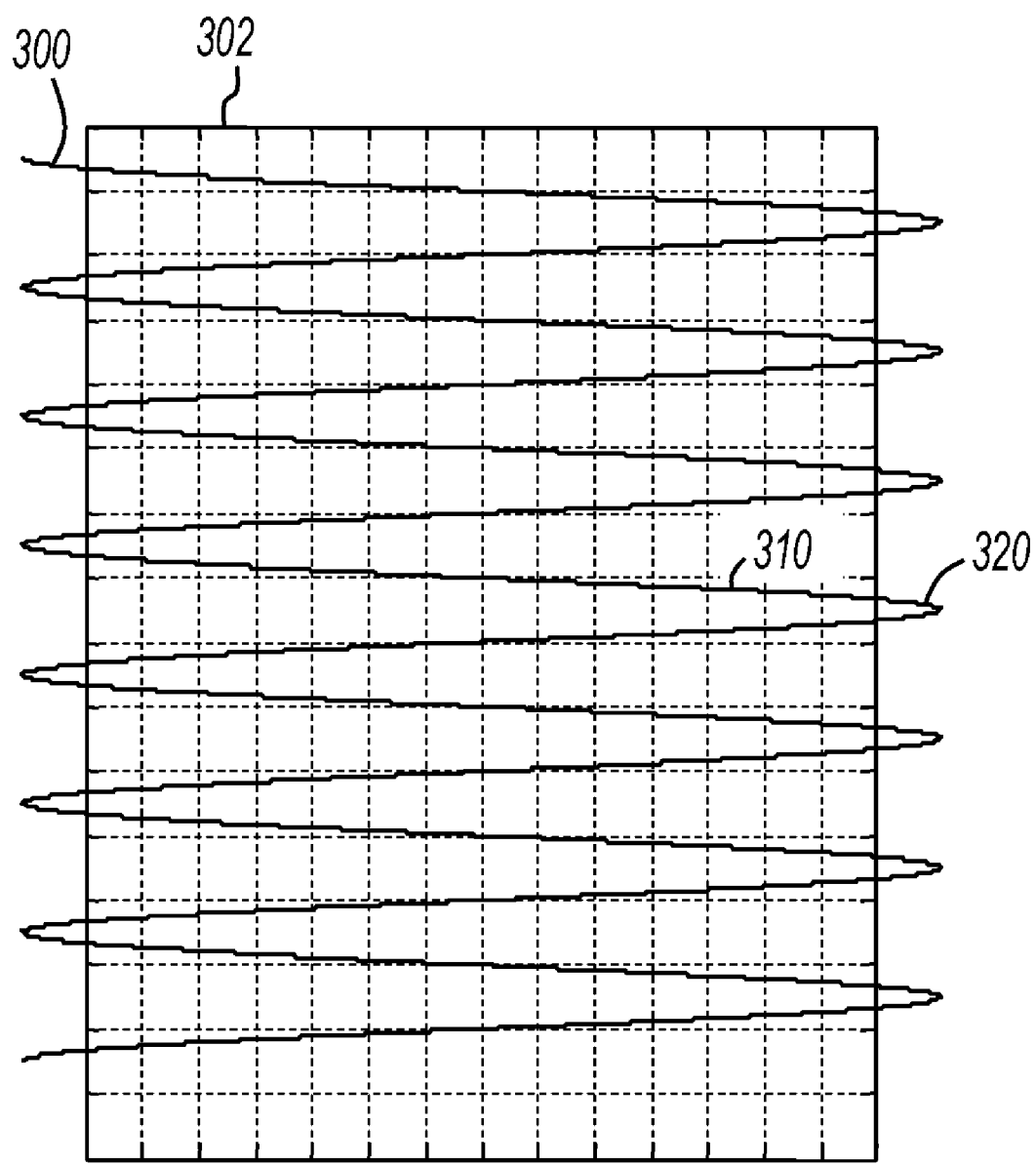
FIG. 3 shows a scan trajectory having an overscan region.

FIG. 3 shows a scan trajectory having a sinusoidal horizontal component and a linear vertical component. Scan trajectory 300 is shown superimposed upon a grid 302. Grid 302 represents rows and columns of pixels that make up a display image. The rows of pixels are aligned with the horizontal dashed lines, and columns of pixels are aligned with the vertical dashed lines. The image is made up of pixels that occur at the intersections of dashed lines. Scan trajectory 300 has a sinusoidal horizontal component and a linear vertical component. On this trajectory, the beam sweeps back and forth left to right in a sinusoidal pattern, and sweeps vertically at a constant rate. In some embodiments, the trajectory sweeps up quickly during a "retrace" and pixels are not displayed on the retrace. In other embodiments, the trajectory sweeps up linearly at the same rate as it swept down, and pixels are display during both up and down vertical sweeps.

A laser projector that sweeps a scan trajectory as shown in FIG. 3 displays pixels at locations that do not necessarily correspond in position to the pixels in grid 302. Various embodiments utilize varying pixel clocks and interpolation techniques to compute the image data to be displayed as the image beam is scanned. At the end of each horizontal sweep 310, scan trajectory 300 enters an "overscan" region that is outside grid 302. For example, point 320 lies in the overscan region.

As described above, a laser diode may heat up during a horizontal sweep as pixels are displayed. Accordingly, the relationship between radiance and laser diode current may not be constant across a horizontal sweep, but instead may be a function of the amount of diode heating that occurs during the sweep based on prior laser diode current values.

In some embodiments, an adaptive model tracks the diode heating during a horizontal sweep and predicts the diode temperature when each pixel is displayed. The current sent to the diode is then a function of desired radiance as well as predicted temperature. The diode temperature may be measured (indirectly by measuring a voltage) in the overscan region, and the actual temperature may be compared to the prediction at the end of the horizontal sweep. An adaptive model may be updated to more closely predict the temperature in future horizontal sweeps. The discussion that follows presents various embodiments of adaptive models and underlying theory.

Figure 4:
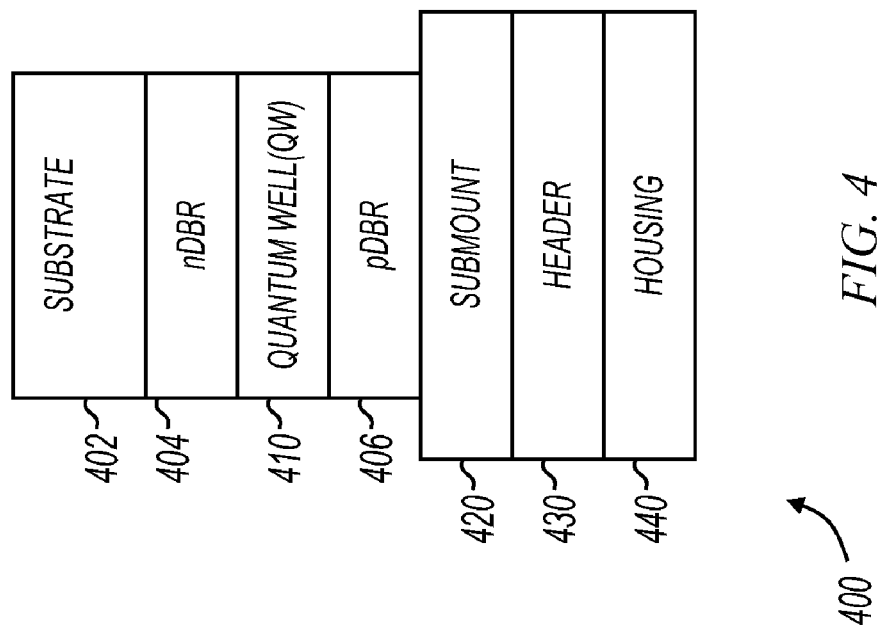
FIG. 4 shows a block diagram of a packaged vertical cavity laser.

FIG. 4 shows a block diagram of a packaged laser diode. Laser diode 400 includes substrate 402, distributed bragg reflectors 404 and 406, quantum well (QW) 410, submount 420, header 430, and housing 440. The various elements within laser 400 are shown in a manner suitable to represent heat dissipation from QW 410, and do not show actual mechanical connections or relationships. As described above, the behaviour of the laser diode is a function of, among other things, the temperature of QW 410. Laser diode 400 may be any type of laser diode, including vertical emitting or side emitting. In some embodiments, laser diode 400 includes fewer than all elements shown in FIG. 4. For example, laser diode 400 may not include distributed bragg reflectors 404 and 406, and/or other elements. Further, the various embodiments described herein may include other self heating device in addition to, or in lieu of, laser diodes.

Figure 5:
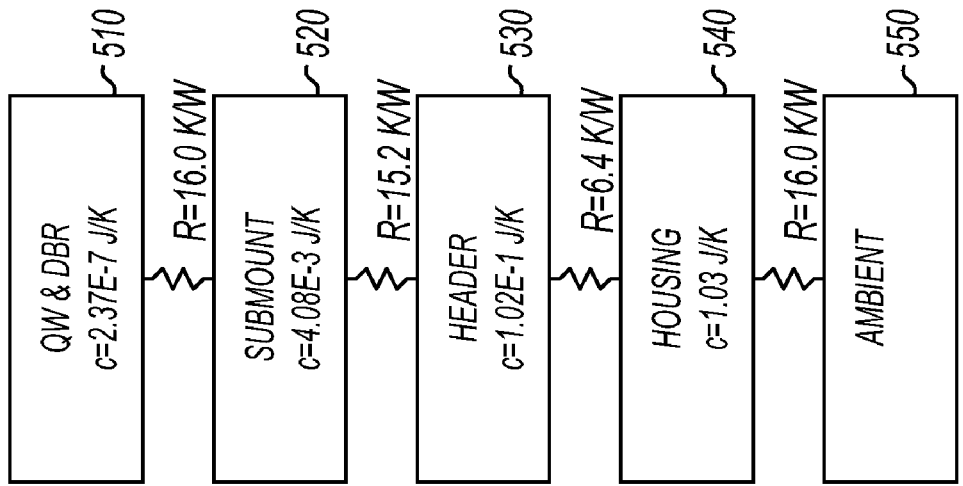
FIG. 5 shows a thermal model of the vertical cavity laser of FIG. 4.

FIG. 5 shows a thermal model of the laser diode of FIG. 4. Each element is represented by a thermal capacitance c, and connections between elements are IS represented by a thermal resistance R. For example, the quantum well and distributed bragg reflectors are modeled at 510, the submount at 520, the header at 530, the housing at 540, and the ambient environment at 550. The elements included in FIGS. 4 and 5 are representative only. Other circuit elements or package elements may be included or substituted without departing from the scope of the present invention. The thermal behaviour of the laser diode can be modeled as a fourth order ordinary differential equation (ODE), or equivalently, as a system of four first order ODEs. The system is as follows:

$$\frac{dT_{QW}}{dt} = \frac{1}{c_{QW}}\left(\frac{-1}{R_{QW}}(T_{QW} - T_{SM}) + Q(t)\right) \quad (1)$$

$$\frac{dT_{SM}}{dt} = \frac{1}{c_{SM}}\left(\frac{-1}{R_{SM}}(T_{SM} - T_{HD}) + \frac{1}{R_{QW}}(T_{QW} - T_{SM})\right) \quad (2)$$

$$\frac{dT_{HD}}{dt} = \frac{1}{c_{HD}}\left(\frac{-1}{R_{HD}}(T_{HD} - T_{HS}) + \frac{1}{R_{SM}}(T_{SM} - T_{HD})\right) \quad (3)$$

$$\frac{dT_{HS}}{dt} = \frac{1}{c_{HS}}\left(\frac{-1}{R_{HS}}(T_{HS} - T_{AM}) + \frac{1}{R_{HD}}(T_{HD} - T_{HS})\right) \quad (4)$$

Where Q(t) is the time dependent heating of the quantum well by the video current. The time constant for the quantum well is $c_{QW}R_{QW}$=3.8E-6 seconds and the time constant for the submount is $c_{SM}R_{SM}$=0.06 seconds. Therefore we can assume that for the duration of a single line of video, the temperature of the submount is constant and we can model the temperature of the quantum well as $$\frac{d\tilde{T}_{QW}}{dt} = \frac{1}{c_{QW}}\left(\frac{-1}{R_{QW}}(\tilde{T}_{QW} - S) + \tilde{Q}(t)\right) \quad (5)$$

Where $\tilde{T}$ represents the modeled quantum well temperature and $\tilde{Q}$ represents the modeled quantum well heating.

In operation, the temperature of the quantum well is indirectly measured by measuring the voltage at a fixed bias voltage. This is facilitated by the relationship $$V(I,T)=a(I)T+b(I). \quad (6)$$

Using equation (6), the equation for the quantum well temperature (1) becomes $$\frac{dV_{QW}}{dt} = \frac{1}{c_{QW}}\left(\frac{-1}{R_{QW}}(V(I, T)_{QW} - b(I) - a(I)T_{SM}) + a(I)Q(t)\right) \quad (7)$$

and the equation for the modeled temperature (5) becomes $$\frac{d\tilde{V}_{QW}}{dt} = \frac{-1}{c_{QW}R_{QW}} \tilde{V}(I,T)_{QW} + \frac{1}{c_{QW}R_{QW}} S - \frac{a(I)}{c_{CW}} Q(t) \quad (8)$$

Here, the unknown term b(I) is incorporated in the sink term S in the modeled equation. This modeled equation is used as an adaptive reference model in parallel with the laser diode. In this way an estimate of the voltage at the probe current is made throughout the scan line. At the end of each scan line, the modeled voltage is compared with the measured laser diode voltage and the adaptive terms in the model are updated.

The voltage is measured in the overscan region at the end of each line of video and using a specified bias current. Limitations in the speed of the circuits and the need to reduce the signal to noise in the voltage signal have resulted in a design that will measure the following quantity $$M = \int_{t_1}^{t_1+T} [V(I_{bias}) - V_{offset}] dt \quad (9)$$

and the numerical results of the adaptive model are processed in a numerically equivalent procedure. The adaptive terms in the model are updated after each measurement using the standard relationship $$F_{new} = F_{old} + G\epsilon \quad (10)$$

Where F represents the adaptive term, $\epsilon$ is the difference between the measured and computed voltage integrals, and G is a gain chosen such that the error converges.

The discussion and the results to this point have assumed that the quantum well capacitance, the thermal resistance, the slope of the voltage vs. temperature curve and the exact power deposition are known exactly. In practice, this may not be completely true. To deal with these uncertainties, the model equations are reformulated as follows:

$$\frac{d\tilde{V}_{QW}}{dt} = -\frac{k}{c} \tilde{V}(I,T)_{QW} + \frac{k}{c} S - \frac{a}{c} Q(t) - e\tilde{V}(I,T) \quad (11)$$

In this way, we can see that the sink term will adjust for the average error in the heating term a/cQ(t), and the last term e $\tilde{V}$(I, T) will account for errors resistance and capacitance. In some embodiments, the only adaptive term in the model is the sink, S. The adaptive reference model is numerically integrated using an initial guess at the sink term; however, if both S and e are adapted using a feedback measurement, the system can be operated without a priori knowledge of the additional unknown parameters.

In operation, two measurements are made to adapt the two parameters S and e. The first measurement is at the first half of the overscan region where the system is most sensitive to time dependent effects. This measurement is used to adapt the unknown parameter e. The second measurement is taken at the second half of the overscan and is used to adapt the sink term S.

Many adaptive reference model equations and/or parameters may be used without departing from the scope of the present invention. The equations presented are intended to be illustrative and are not meant to limit the various invention embodiments.

Figure 6:
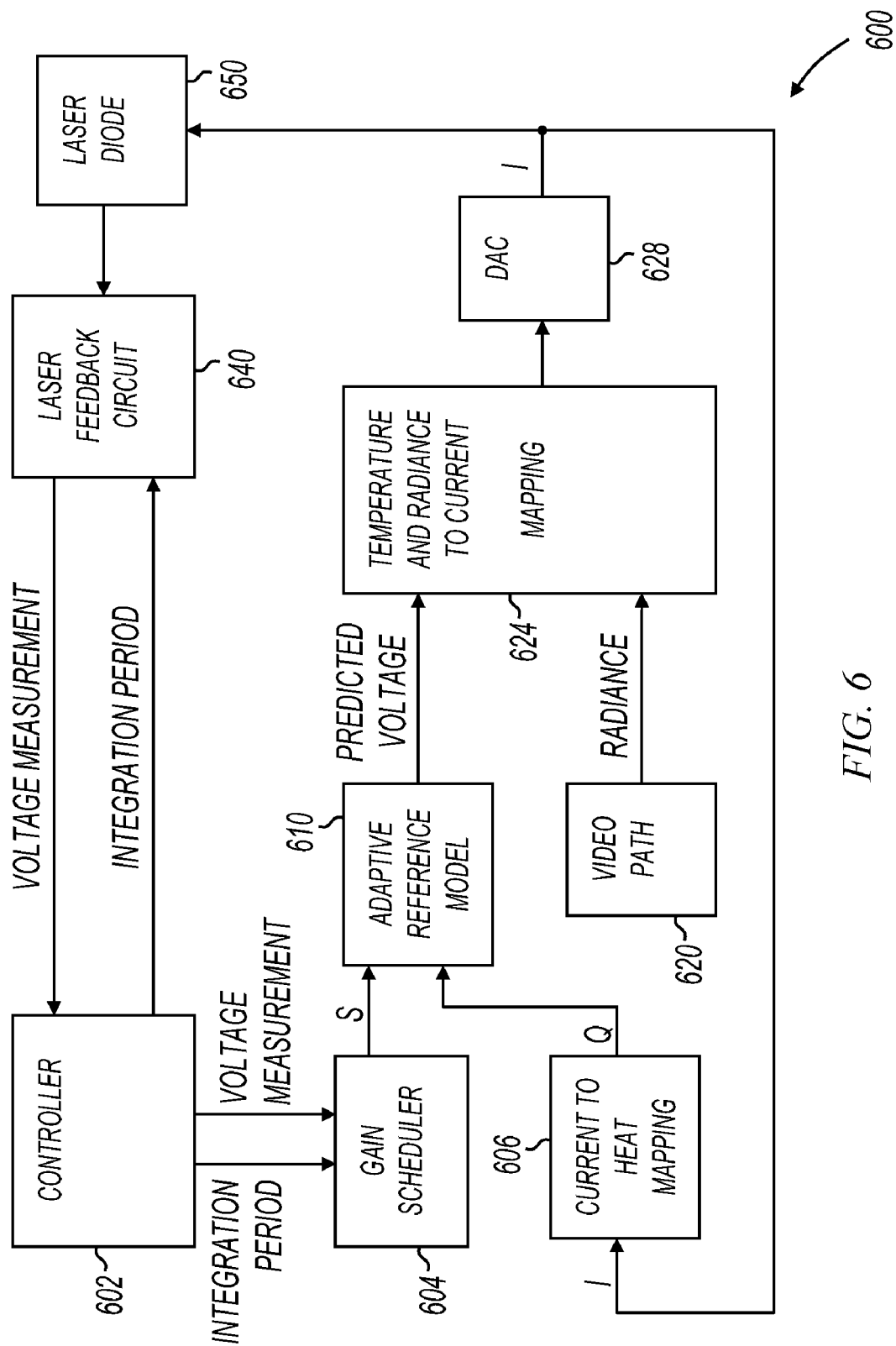
FIG. 6 shows a model reference adaptive system for temperature compensation of a laser projection system.

FIG. 6 shows a model reference adaptive system for temperature compensation of a laser projection system. System 600 includes laser diode 650, laser feedback circuit 640, controller 602, gain scheduler 604, adaptive reference model 610, video path 620, temperature and radiance to current mapping component 624, digital to analog converter (DAC) 628, and current to heat mapping component 606.

In operation, video path 620 receives images to be displayed and determines desired pixel radiance for each pixel to be displayed. In some embodiments, the radiance data may represent three separate colors (e.g., red, green, and blue) and the various blocks in system 600 perform separate operations for each of the three colors. Adaptive reference model 610 predicts and outputs a new estimate of the voltage at each pixel clock. The desired radiance and the predicted voltage values are input to temperature and radiance to current mapping component 624 that outputs the current required to realize this radiance at the predicted temperature (voltage). This value is then mapped through DAC 628 to the laser diode 650.

In some embodiments, component 624 is implemented as a look up table. Calibration data is entered in the look up table to effect the mapping of desired radiance and predicted voltage to current. In other embodiments, component 624 is implemented as a block that evaluates an analytical expression. The analytical expression may be arrived at via calibration. Calibration is described further below.

Laser feedback circuit 640 measures the diode voltage in the overscan region while the laser is driven with the bias current. The bias current is defined such that it is ensured that it is below the laser threshold for all possible operating points. In some embodiments, the voltage is measured over an integration period defined by controller 602. Controller 602 may define the integration period such that the magnitude of the measurement is near the saturation point of the measuring analog to digital converter (ADC) without exceeding it. The integration period and the measurement are delivered to gain scheduler 604 by controller 602. The gain scheduler computes the analogous voltage integral using the time dependent voltage that has been computed by the adaptive reference model. It then computes the difference between the measured value and the value computed from the reference model and computes a new estimate of the adapted sink S or e term in the adaptive reference model. The term is used to update the reference model.

In some embodiments, adaptive reference model 610 is solved using the following discretized equation:

$$V_n = \kappa V_{n-1} + S + \lambda dt Q_{n-1} \quad (12)$$

$$\kappa = \left(1 - \frac{k}{c} dt - e dt\right) \quad (13)$$

$$\lambda = \frac{a}{c} dt \quad (14)$$

where S=sink (this is adapted), and e=time constant correction (this may be adapted). This equation is solved at each pixel clock for the updated estimate of the diode voltage. At startup, the initial voltage is initialized using the approximation:

$$V_o = aT_{ambient} + b \quad (15)$$

The values for a and b are established via analysis and are approximations.

Adaptive reference model 610 receives a value for Q corresponding to each displayed pixel. This is provided by current to heat mapping component 606. In some embodiments, component 606 may be implemented as a look up table that maps laser diode drive current to heat. The contents of the look up table may be established by calibration, which is further described below. In other embodiments, component 624 is implemented as a block that evaluates an analytical expression. The analytical expression may be arrived at via calibration.

In some embodiments, additional current is driven through the laser diode in the overscan region after the voltage measurement is made. By driving additional current, the diode can be intentionally heated to improve or otherwise affect its performance or efficiency. "Pre-heating" the diode in this manner may limit the temperature excursions that the diode takes, and may also improve the performance of the adaptive reference model.

As shown in FIG. 6, system 600 includes a laser diode and a drive circuit to produce a drive current for the laser diode. The drive circuit includes an adaptive reference model and a feedback circuit to update the model. In some embodiments, system 600 includes multiples of each component shown. For example, the drive circuit may include three adaptive models and feedback circuits to compensate for temperature variations in three diodes that create a color display. In some embodiments, more than three laser diodes may be driven by the drive circuit(s).

The various embodiments of the present invention provide compensation for heating of a laser diode. Heating caused by historical drive currents are compensated, and so is heating caused by ambient temperature changes.

In various embodiments of the invention, two calibrations may be performed. The first measures the relationship between laser diode drive current and power deposited at the diode junction. These results populate the look up table in current to heat mapping component 606. The second calibration produces a table that maps the diode voltage (i.e., temperature) and the commanded radiance to a laser diode drive current. These results populate a look up table in temperature and radiance to current mapping component 624. In some embodiments, the calibration procedures may include steps to produce analytical expressions for the mappings instead of populating look up tables. Analytical expressions may be produced using any suitable method, including various curve fitting algorithms.

Mapping of the current to the power deposition, Q, may be done using a constant drive current while measuring the voltage across the diode. Any data collected is an approximation because the data is collected when the temperature of the quantum well is in thermal equilibrium with the current. The relationship between temperature and voltage presents a difficult calibration procedure. For example, one way to determine the temperature of the quantum well is to establish the temperature using a cooling device and a temperature sensor. To ensure that the measured temperature is the same as that of the quantum well, the system may be allowed to reach steady state before taking a data point. This could take several seconds and is inconsistent with manufacturing requirements. In some embodiments, the slope and intercept of the voltage vs. temperature line may be inferred from the errors that persist after the adaptive model converges.

The calibration of predicted voltage and desired radiance to diode drive current may proceed as follows:

1. Using a full on white screen, run the errors to zero on both the sink and decay rate terms.
2. Turn off the gain for the decay rate term.
3. Develop ten calibration waveforms that operate at a frequency of one cycle per ten pixels and with increasing duty cycles from 0.0 to 1.
4. During the measurement window compute the average probe voltage that is predicted by the adaptive model.
5. During the measurement window measure the average radiance at the photo detector.
6. Populate the table with the calibration current, predicted average probe voltage and the average radiance multiplied by the duty cycle.

Figure 7:
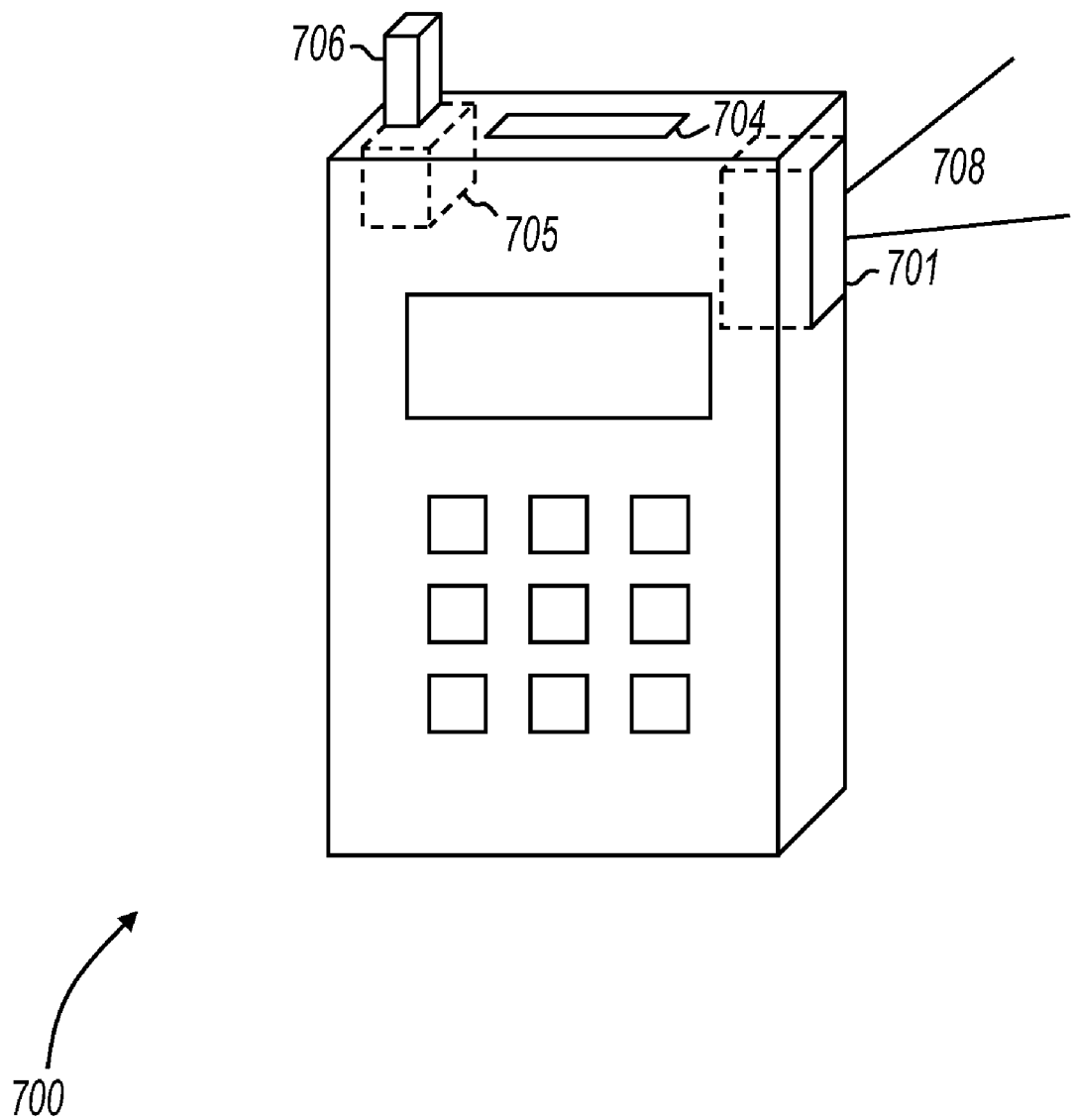
FIG. 7 shows a mobile device in accordance with various embodiments of the present invention.

FIG. 7 shows a mobile device in accordance with various embodiments of the present invention. Mobile device 700 may be a hand held projection device with or without communications ability. For example, in some embodiments, mobile device 700 may be a handheld projector with little or no other capabilities. Also for example, in some embodiments, mobile device 700 may be a device usable for communications, including for example, a cellular phone, a smart phone, a personal digital assistant (PDA), a global positioning system (GPS) receiver, or the like. Further, mobile device 700 may be connected to a larger network via a wireless (for example, WiMax) or cellular connection, or this device can accept data messages or video content via an unregulated spectrum (for example, WiFi) connection.

Mobile device 700 includes laser projector 701 to create an image with light 708. Similar to other embodiments of projection systems described above, mobile device 700 may include an adaptive model to compensate for temperature variations in laser diodes.

In some embodiments, mobile device 700 includes antenna 706 and electronic component 705. In some embodiments, electronic component 705 includes a receiver, and in other embodiments, electronic component 705 includes a transceiver. For example, in GPS embodiments, electronic component 705 may be a GPS receiver. In these embodiments, the image displayed by laser projector 701 may be related to the position of the mobile device. Also for example, electronic component 705 may be a transceiver suitable for two-way communications. In these embodiments, mobile device 700 may be a cellular telephone, a two-way radio, a network interface card (NIC), or the like.

Mobile device 700 also includes memory card slot 704. In some embodiments, a memory card inserted in memory card slot 704 may provide a source for video data to be displayed by laser projector 701. Memory card slot 704 may receive any type of solid state memory device, including for example, Multimedia Memory Cards (MMCs), Memory Stick DUOs, secure digital (SD) memory cards, and Smart Media cards. The foregoing list is meant to be exemplary, and not exhaustive.

Figure 8:
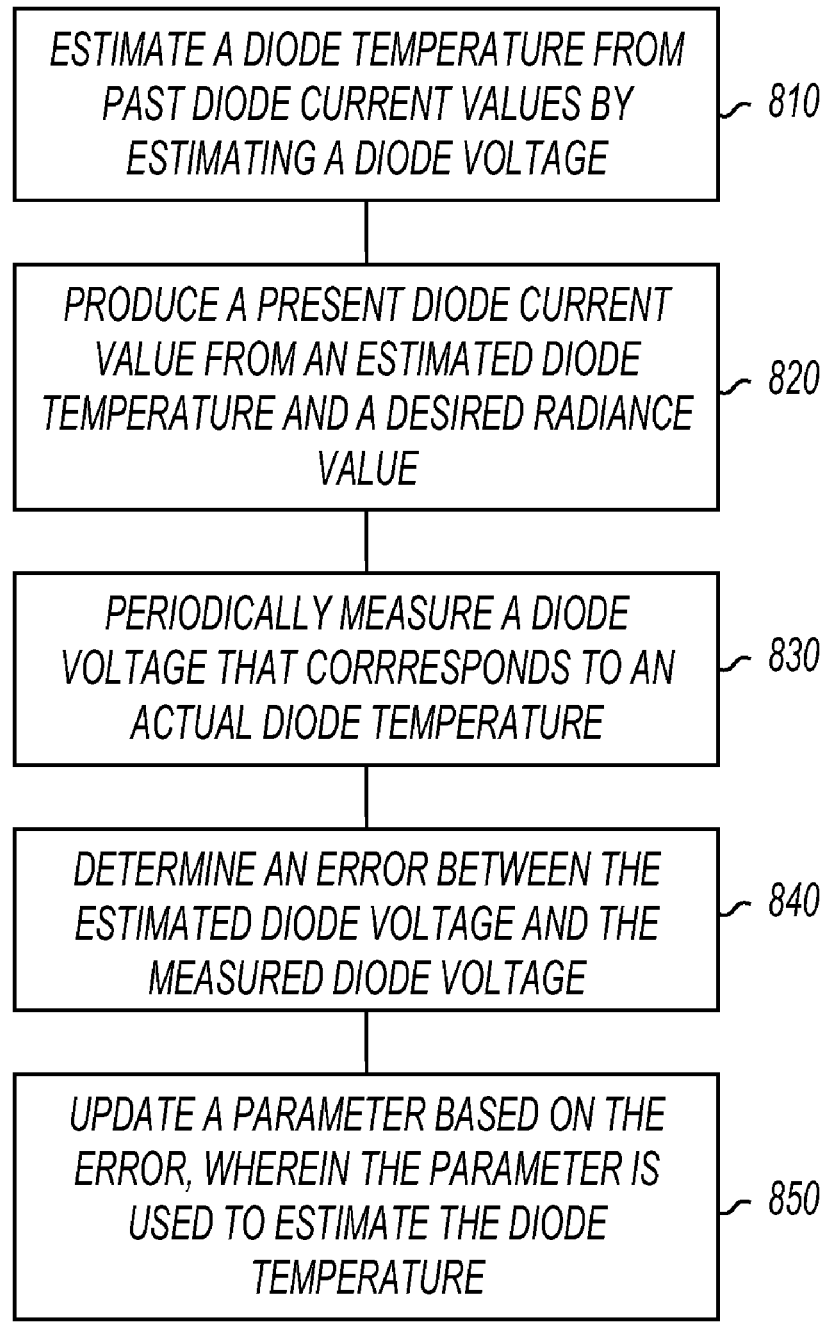
FIG. 8 shows a flowchart in accordance with various embodiments of the present invention.

FIG. 8 shows a flowchart in accordance with various embodiments of the present invention. In some embodiments, method 800, or portions thereof, is performed by a laser projector, a mobile device, or the like, embodiments of which are shown in previous figures. In other embodiments, method 800 is performed by an integrated circuit or an electronic system. Method 800 is not limited by the particular type of apparatus performing the method. The various actions in method 800 may be performed in the order presented, or may be performed in a different order. Further, in some embodiments, some actions listed in FIG. 8 are omitted from method 800.

Method 800 is shown beginning with block 810 in which a diode temperature is estimated from past diode drive current values. For example, in some embodiments, diode drive current values for pixels in a row of video data are mapped to heat values that are integrated. The temperature of the diode is related to the diode voltage, and in some embodiments, the diode voltage is estimated, where the diode voltage is a function of the temperature.

At 820, a diode current for a present pixel display is produced from the estimated diode temperature and a desired radiance value. In some embodiments, this is performed using a look up table that holds calibration data.

At 830, the diode voltage is periodically measured, and the diode voltage corresponds to the actual diode temperature. For example, the diode voltage may be measured in an overscan region at the end of a horizontal scan line after displaying a line of video. In some embodiments, additional current is driven through the laser diode after the measurement. The additional drive current may further heat the diode and limit temperature excursions.

At 840, an error between the estimated diode voltage and the measured diode voltage is determined, and at 850, a parameter in an adaptive model is updated in response to the error. The adaptive model is used in 810 to estimate the diode temperature. In some embodiments, the updated parameter corresponds to a sink value that is used to model heat transfer from the diode.

Although the present invention has been described in conjunction with certain embodiments, it is to be understood that modifications and variations may be resorted to without departing from the spirit and scope of the invention as those skilled in the art readily understand. Such modifications and variations are considered to be within the scope of the invention and the appended claims.

What is claimed is:

1. An apparatus comprising:
   a laser diode to emit light in response to a drive current;
   an adaptive model to estimate a quantum well temperature of the laser diode in response to prior values of the drive current, the adaptive model to provide an estimated quantum well temperature;
   a mapping component to map the estimated quantum well temperature and a desired radiance value to the drive current; and
   a second mapping component operable to map drive current to quantum well heating, and to provide an estimate of the quantum well heating to the adaptive model.

2. The apparatus of claim 1 further comprising a feedback circuit coupled to periodically measure a voltage across the laser diode and update at least one parameter within the adaptive model.

3. The apparatus of claim 2 wherein the feedback circuit is operable to integrate the voltage across the laser diode for an integration period.

4. The apparatus of claim 2 wherein the estimated quantum well temperature is represented by an estimated diode voltage.

5. The apparatus of claim 4 wherein the feedback circuit comprises a gain scheduler operable to determine an error between the measured voltage across the laser diode and the estimated diode voltage, and further operable to update the at least one parameter in response to the error.

6. The apparatus of claim 2 wherein the feedback circuit is operable to measure the voltage across the laser diode in an overscan region of an image.

7. The apparatus of claim 1 wherein the mapping component comprises a look up table having data generated using a calibration procedure.

8. The apparatus of claim 1 wherein the at least one parameter within the adaptive model comprises a sink term that influences modeled heat transfer from the quantum well.

* * * * *